United States Patent [19]
Krenik

[11] Patent Number: 4,849,757
[45] Date of Patent: Jul. 18, 1989

[54] INTEGRATED DUAL-SLOPE ANALOG TO DIGITAL CONVERTER WITH R/C VARIANCE COMPENSATION

[75] Inventor: William R. Krenik, Dallas, Tex.
[73] Assignee: Texas Instruments Incorporated, Dallas, Tex.
[21] Appl. No.: 30,198
[22] Filed: Mar. 25, 1987
[51] Int. Cl.$^4$ .............................................. H03M 1/50
[52] U.S. Cl. .................................. 341/167; 341/155; 341/166
[58] Field of Search ................. 340/347 NT, 347 AD, 340/347 CC, 347 C, 347 M; 324/99 D; 357/14, 51, 59 F; 323/370; 368/202, 204, 219; 338/292, 293, 7–10; 361/274; 341/155, 166–170, 118

[56] References Cited

U.S. PATENT DOCUMENTS

| | | | |
|---|---|---|---|
| 3,316,547 | 4/1967 | Ammann | 340/347 NT |
| 3,402,372 | 9/1968 | Wasyluk | 323/370 X |
| 4,020,222 | 4/1977 | Kausche et al. | 361/274 X |
| 4,063,210 | 12/1977 | Collver | 338/7 |
| 4,502,894 | 3/1985 | Seto et al. | 357/59 F X |
| 4,581,795 | 4/1986 | Mobbs et al. | 361/274 X |
| 4,704,625 | 11/1987 | Lee | 357/14 X |

OTHER PUBLICATIONS

Schmid, Electronic Analog/Digital Conversions, Van Nostrand Reinhold, 1970, pp. 282–283.
Dewitt et al, Transistor Electronics, McGraw-Hill Book Co., Inc., 1957, pp. 303 & 304.

Primary Examiner—William M. Shoop, Jr.
Assistant Examiner—Brian Young
Attorney, Agent, or Firm—Michael E. Melton; Leo N. Heiting; Melvin Sharp

[57] ABSTRACT

A dual-slope A/D converter circuit has an oscillator (14) whose timing frequency is determined by the value of an oscillator resistor (70) and a oscillator capacitor (72). An integrator (66) integrates an input voltage at a rate determined by an integrating resistor (64) and an integrating capacitor (68). The oscillator resistor (70) and integrator resistor (64) are designed such that their ratio will remain constant despite variations in actual value due to manufacturing inaccuracies. The oscillator capacitor (72) and integrating capacitor (68) are similarly designed. Consequently, an optimum peak integration value can be obtained at full scale input despite variations in actual resistive and capacitive values.

24 Claims, 2 Drawing Sheets

INTEGRATED DUAL-SLOPE ANALOG TO DIGITAL CONVERTER WITH R/C VARIANCE COMPENSATION

TECHNICAL FIELD OF THE INVENTION

This invention pertains in general to analog-to-digital converters, and more particularly to an integrated dual-slope analog-to-digital converter.

BACKGROUND OF THE INVENTION

Analog-to-digital (A/D) converters operate to produce a numerical representation of an input voltage. One class of A/D converters is known as "dual-slope" A/D converters. Typically, a dual-slope A/D converter integrates the input voltage from a predetermined starting voltage level to a peak voltage level over a predetermined time period, and deintegrates a reference voltage from the peak voltage level back to the starting voltage level. Conversely, a dual-slope A/D converter may integrate a reference voltage over a predetermined time period and deintegrate the input voltage. The time required for disintegration is compared to the predetermined time-period to determine the ratio of the reference voltage to the input voltage.

Dual-slope analog-to-digital converters are sold in high volumes for use in digital panel meters, voltage meters, and other instrumentation and control applications. Since they can be readily implemented in either bipolar or MOS technology and are capable of resolution well beyond fifteen bits, they have become the industry's standard for a low-speed, high precision A/D conversion. For maximum resolution and reliability, it is desirable to set the peak voltage level corresponding to the maximum allowable input voltage to an optimum level. Unfortunately, previously developed dual-slope A/D converters require a precision resistor and capacitor which cannot be accurately implemented onto an integrated circuit along with the rest of the A/D circuitry.

Variations in the resistive and capacitive values affect the rate of integration, and hence, adversely affect the peak voltage level obtained during integration. Using an external resister and capacitor also presents several problems including additional costs, size, parasitic leakage, noise injection and temperature-related variations. These problems reduce the ability of dual-slope A/D converters to compete with "successive approximation" A/D converters in low resolution (less than ten bits) applications and result in high system costs and poorer performance in high precision applications where dual-slope A/D converters are the only available choice.

Therefore, a need exists in the industry for a dual-slope A/D converter which can be integrated on single chip without reduction in accuracy due to the inherent variance in resistor and capacitor values caused by the manufacturing process.

SUMMARY OF THE INVENTION

The present invention disclosed and claimed herein describes a method and apparatus for performing a dual-slope analog-to-digital conversion on an integrated chip which substantially eliminates problems associated with prior dual-slope analog-to-digital converters.

In one aspect of the present invention, a dual slope analog-to-digital converter has an oscillator for generating timing information and an integrator for integrating an input voltage over a predetermined number of oscillations. The oscillator is designed such that its frequency varies proportionally to the rate of integration, thereby offsetting a rate of integration deviating from a desired value. An advantage associated with this aspect of the invention is that a stable peak integration level is maintained despite inaccuracies in the actual rate of integration, or the actual rate of oscillation. Another advantage is that temperature effects on the integrator are similarly offset.

In another aspect of the invention, a fully integrated dual-slope analog-to-digital converter has an input to receive an analog voltage for conversion to a numerical value of the voltage, an oscillator for generating timing information, and an integrator for integrating the input voltage over a predetermined time interval and integrating a reference voltage over a measured time interval. The oscillator generates the timing information at a rate inversely proportional to the RC time constant determined by multiplying the values of the oscillator's resistor and capacitor. The rate of integration is inversely proportional to the integrator's resistor and capacitor. By manufacturing the integrator's resistor substantially simultaneously and in close proximity with the oscillator's resistor and manufacturing the integrator's capacitor in close proximity with the oscillator's capacitor, the proportional variations in the values of the resistive and capacitive elements from their desired value can be made substantially identical in both the integrator and the oscillator. This aspect of the invention has the advantage that an optimum peak voltage level for a full scale input voltage can be achieved despite substantial variations in the values of the resistive and capacitive values from designed levels. Because all the critical leakage nodes are internal to the integrated circuit, parasitic effects can be accounted for and controlled. Also, special cleaning and coating of the printed circuit boards is not necessary since the leakage nodes are internal.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

The preferred embodiment of the present invention is best understood by referring to FIGS. 1–5 of the drawings, like numerals being used for like and corresponding parts of the various drawings.

Figure 1:
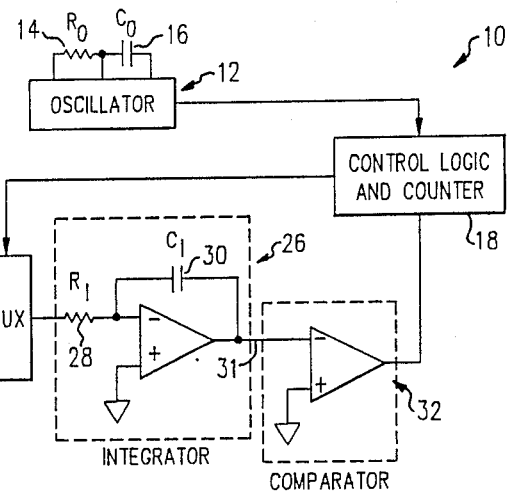
FIG. 1 illustrates a dual-slope A/D converter.

A circuit for implementing a dual-slope analog-to-digital converter 10 (hereinafter "A/D" 10) is illustrated in FIG. 1. An oscillator 12 having a resistor, $R_O$ 14, and a capacitor, $C_O$ 16, is connected to a control logic and counter section 18. The control logic and counter section 18 outputs a signal to a multiplexer 20 which has a input voltage 22 and a reference voltage 24 as inputs. The output of the multiplexer 20 is connected to an integrator 26 which has a resistor, $R_1$ 28 and a capacitor, $C_I$ 30. The output 31 of the integrator 26 is connected to the input of a comparator 32. The output of the comparator 32 is connected to the control logic and counter section 18.

Figure 2:
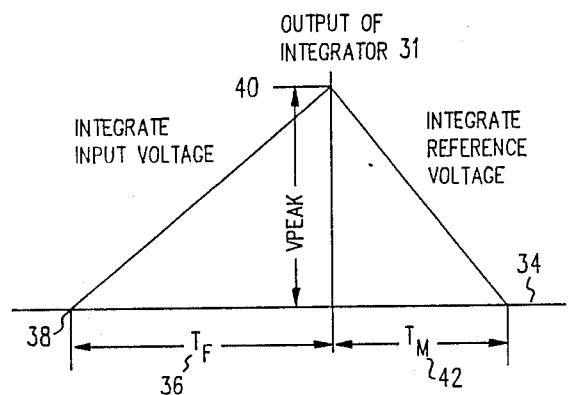
FIG. 2 illustrates the integrator output of the circuit of FIG. 1.

The operation of the A/D 10 will be discussed in connection with the graph of FIG. 2. The comparator 32 outputs a signal when the voltage input to the comparator 32 from the integrator 26 equals a preset starting voltage 34. When the voltage at the output 31 of the integrator 26 equals the preset starting voltage 34, a signal, such as a logical 1, is output from the comparator 32 to the control logic and counter section 18. The integrator 26 integrates the voltage at its input over time. The rate of integration is determined by $R_I$ 28 and $C_I$ 30.

Initially, the output 31 of the integrator 26 is set to the preset starting level 34. In the preferred embodiment, the multiplexer 20 is set to allow the reference voltage 24 to pass to the input of the integrator 26. The reference voltage 24 is a negative voltage, causing a continuous reduction in the voltage present at the output 31 of the integrator 26. When the output 31 reaches the preset starting level 34, the comparator 32 outputs a signal to the control logic and counter section 18. This signifies that an initial condition has been reached and the analog-to-digital conversion may be begin.

It will be understood that the present invention also encompasses a variation using an "auto-zero" phase to set the output 31 to a present level. In this variation, the output of the comparator 32 is looped back to the input of the integrator 30 to reach the preset starting level 34.

After receiving the signal from the comparator 32, the control logic and counter section 18 outputs a signal to the multiplexer 20 indicating that the input voltage 22 should be passed to the integrator 26. Simultaneously, a counter in the control logic and counter section 18 begins counting oscillations output from the oscillator 12. The input voltage 22 is integrated over a predetermined number of oscillations. In the illustrated embodiment of FIG. 1, the time period associated with each oscillation is determined by the RC time constant associated with the particular values of $R_O$ 14 and $C_O$ 16 used in the oscillator 12; alternatively, some oscillators used a crystal to determine the time period of each oscillation. A predetermined time period, illustrated in FIG. 2 as $T_f$ 36, can be determined by multiplying the time period associated with each oscillation by the predetermined number of oscillations counted during the integration period.

Again referring to FIG. 2, the integration of the input voltage is illustrated. Beginning at starting point 38 (i.e., the time at which the initial preset voltage 34 is reached), the input voltage 22 is integrated over the fixed time, $T_f$ 36. By the end of $T_f$ 36, the output 31 of the integrator 26 has reached a value of $V_{peak}$ 40. Assuming a fixed oscillation rate, and a fixed rate of integration, $V_{peak}$ will vary proportionally with the input voltage 22.

Once the predetermined number of oscillations have been counted, the control logic and counter section 18 reverses the signal to the multiplexer 20, resulting in the reference voltage 24 being passed to the input of the integrator 26. The reference voltage 24 is integrated until the preset starting voltage 34 is reached. During integration, the number of oscillations are counted, rendering the time needed to "deintegrate" $V_{peak}$ 40. This measured time period is indicated as $T_m$ 42. When the initial preset voltage 34 is reached, the comparator 32 will output a signal to the control logic and counter section 18 indicating that the output 31 is equal to the preset voltage.

Although the illustrated embodiment shows a dual-slope A/D with a single reference voltage, it may be desirable to have both positive and negative reference voltages; the negative reference voltage being used for deintegrating positive input voltages, and the positive reference voltage being used to deintegrate negative input voltages. The polarity of the input signal may be determined by use of a comparator after integration of the input signal.

The level of the input voltage 22 may be determined by the following equation:

$$\text{Input voltage} = \text{reference voltage} \times (T_m/T_f) \quad (1)$$

Equivalently, the input voltage 22 can be determined using the number of oscillations counted during integration by the following equation:

$$\text{Input Voltage} = \text{reference voltage} \times (N_m/N_f) \quad (2)$$

where $N_f$ equals the predetermined number of oscillations counted during integration of the input voltage and $N_m$ equals the number of oscillations counted during integration of the reference voltage.

Hence, it would appear from equation (2) that a dual-slope A/D converter can determine the input voltage 22 independently of the rate of integration or the time period associated with the oscillations. However, to provide the maximum resolution, it is important to the $V_{peak}$ approximate an optimum value at the maximum allowable input voltage 22 (hereinafter "full scale input"). If $V_{peak}$ substantially exceeds the ideal voltage at a full scale input, then the output 31 of the integrator 26 will saturate prior to reaching the actual value of $V_{peak}$, resulting in an errant calculation of the input voltage 22. On the other hand, if $V_{peak}$ 40 is substantially below the ideal voltage at full scale input, then the incremental voltage associated with the number of bits of resolution will be smaller than the optimum incremental voltage. If the incremental voltage is too small, input noise to the integrator 26 and comparator 32 will affect the readings, particularly at low input voltages 22. Also, power supply feedthrough noise, such as inductive voltage spikes at the power supply and ground pins, may cause inconsistent readings at low incremental voltages. Therefore, it is desirable to stabilize $V_{peak}$ at or close to an ideal peak voltage. The ideal peak voltage at full scale input (hereinafter "$V_{peakman}$") will depend on the technology used to implement the A/D converter, but should be set within a few hundred millivolts of the positive supply rail in order to optimize the A/D's noise immunity. Also, it is important that $V_{peakmax}$ remain stable over temperature variations.

Thus, the oscillation time period and the rate of integration must be coordinated such that an ideal $V_{peakmax}$ is obtained at full scale input. To a certain extent, different rates of oscillation and rates of integration may be used to achieve an ideal $V_{peakmax}$. For example, a longer oscillation period may be compensated for a slower rate of integration. Also, the number of oscillations counted during the $T_f$ period 36 may be varied, to accommodate a certain rate of oscillation. However, a longer $T_f$ period 36 will result in a slower response time, while a reduction of the number of oscillations counted during the $T_f$ period 36 will result in less accuracy in calculating the value of the input voltage 22.

Once the rate of integration and the rate of oscillation have been decided upon, a resistor and capacitor combination for both the oscillator 12 and the integrator 26 must be determined to implement the desired rates. Once the values of $R_O$ 14, $C_O$ 16, $R_I$ 28 and $C_I$ 30 have been determined, it is important that the resistive and capacitive values used in the circuit match the desired values; otherwise, the rate of integration in/or the rate of oscillation may affect the desired value of $V_{peakmax}$.

The need for precise accuracy in implementing resistive and capacitive values in the A/D converter 10 has heretofore prevented integration of these components along with the rest of the A/D circuitry. While oxide and oxide/nitride capacitors provide a high quality capacitor, and polysilicon and thin-film resistors provide high quality resistors, the accuracy with which the resistive and capacitive values can be controlled in manufacturing is relatively poor. Typical ranges of parameter variation may vary from 15–35 percent from the predetermined desired values.

Assuming that $T_f$ can be accurately controlled, the $V_{peakmax}$ can be shown to be proportional to the reciprocal of the $R_I C_I$ product by the following equation:

$$V_{peakmax} = \text{full scale input} \times (T_f)/(R_I C_I) \quad (3)$$

Using values typical in the industry, the $R_I C_I$ product can vary from $-40\%$ to $+80\%$. Hence, $V_{peakmax}$ will also vary by $-40\%$ to $+80\%$. If no trimming of the A/D is allowed after manufacturing, the nominal design value for $V_{peakmax}$ will have to be set at around 50% of the optimal value, resulting in worst-case units set at approximately 80% below the optimal design level. Consequently, this variation will cost 2–3 bits of converter precision, making the fully integrated dual-slope A/D essentially unrealizable for high precision instrumentation applications. Furthermore, is such a converter was constructed, its performance would vary widely from one manufacturing lot to the next. This would be objectionable at any resolution level.

Figure 3:
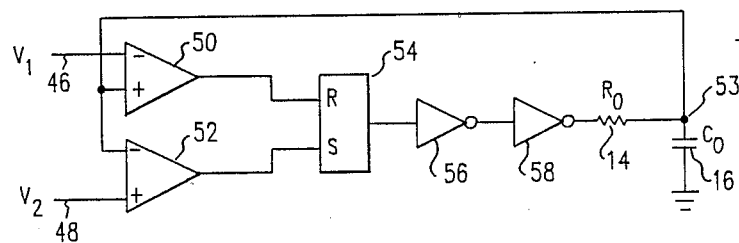
FIG. 3 illustrates an oscillator circuit.

Referring now to FIG. 3, the preferred embodiment for an oscillator circuit 44 is illustrated. By implementing the oscillator circuit 44 in conjunction with the other components of the A/D 10 on an integrated chip, an A/D converter which is essentially immune to variations in the accuracy of the resistive and capacitive elements can be obtained.

The oscillator 44 has a first supply voltage 46 and a second supply voltage 48 input to a first comparator 50 and a second comparator 52, respectively. The inputs 50a and 52a of the comparators 50 and 52 are connected to a node 53 between the resistor $R_O$ 14 and capacitor $C_O$ 16. The output of the first comparator 50 is connected to the "reset" input of an RS flip-flop 54 and the output of the second comparator 52 is connected to the "set" input of the RS flip-flop 54. The output of the RS flip-flop is connected to a first inverter 56. The output of the first inverter 56 is connected to the input of the second inverter 58. The output of the second inverter 58 is connected to one end of the resistor $R_O$ 14. The other end of the resistor $R_O$ 14 is connected to the node 53, which is also connected to one plate of the capacitor $C_O$ 16. The other plate of the capacitor $C_O$ 16 is connected to ground.

In operation, the first supply voltage 46 is set to a value higher than the second supply voltage 48. Assuming an initial output voltage at the node 53, the second comparator 52 is tripped, setting the RS flip-flop 54, i.e., causing a high output of the RS flip-flop 54. After propagating through the two inverters 56 and 58, a high signal will appear at $R_O$ 14, thus charging the capacitor $C_O$ 16. The voltage at the node 53 will continue to increase until it reaches a value equal to the first supply voltage 46 at which time the first comparator 50 will trip, thus resetting the RS flip-flop 54. With the output of the RS flip-flop 54 at a low signal, the voltage at the node 53 will decrease until such time that the voltage at the node 53 is equal to the second supply voltage 48, which will cause the cycle to repeat. Hence, the node 53 will oscillate in voltage at a rate determined by $R_O$ 14 and $C_O$ 16.

In the preferred embodiment, the first and second supply voltages 46 and 48 are derived from the power supply through a resistive divider. For example, the first and second supply voltages 46 and 48 could be set at two-thirds of the power supply voltage and one-third of the power supply voltage respectively. This embodiment has the advantage that the oscillation frequency becomes independent of the power supply voltage.

An advantage of the oscillator circuit 44 is that it can be implemented on an integrated circuit such that the frequency of the oscillator will compensate for a deviation in the rate of integration due to varying resistive and capacitive values. Since $T_f = (a)(R_O C_O)$, where $(a)$ is a constant, equation (3) can be rewritten as:

$$V_{peakmax} = (a) \ (R_O C_O) \times \text{full scale input} \times (1 R_I C_I) = (a) \times \text{full scale input} \times (R_O/R_I)(C_O/C_I) \quad (4)$$

Since (a) and the full scale input are constants, $V_{peakmax}$ can be controlled by maintaining a constant ratio of $R_O$ to $R_I$ and a constant ratio of $C_O$ to $C_I$. In other words, $R_I$ can vary from an ideal value so long as $R_O$ varies in the same proportion. Similarly, $C_I$ can vary from the ideal, if $C_O$ varies accordingly. Using this technique, $V_{peakmax}$ can be stabilized to within a few percent of its optimum level, thus allowing for consistent, high performance of the A/D 10.

In the preferred embodiment, a relaxation type oscillator, such as illustrated in FIG. 3, is used. However, other types of oscillators, such as phase shift oscillators, may also be used, so long as the frequency of the oscillator varies inversely with the RC time constant.

Figure 4:
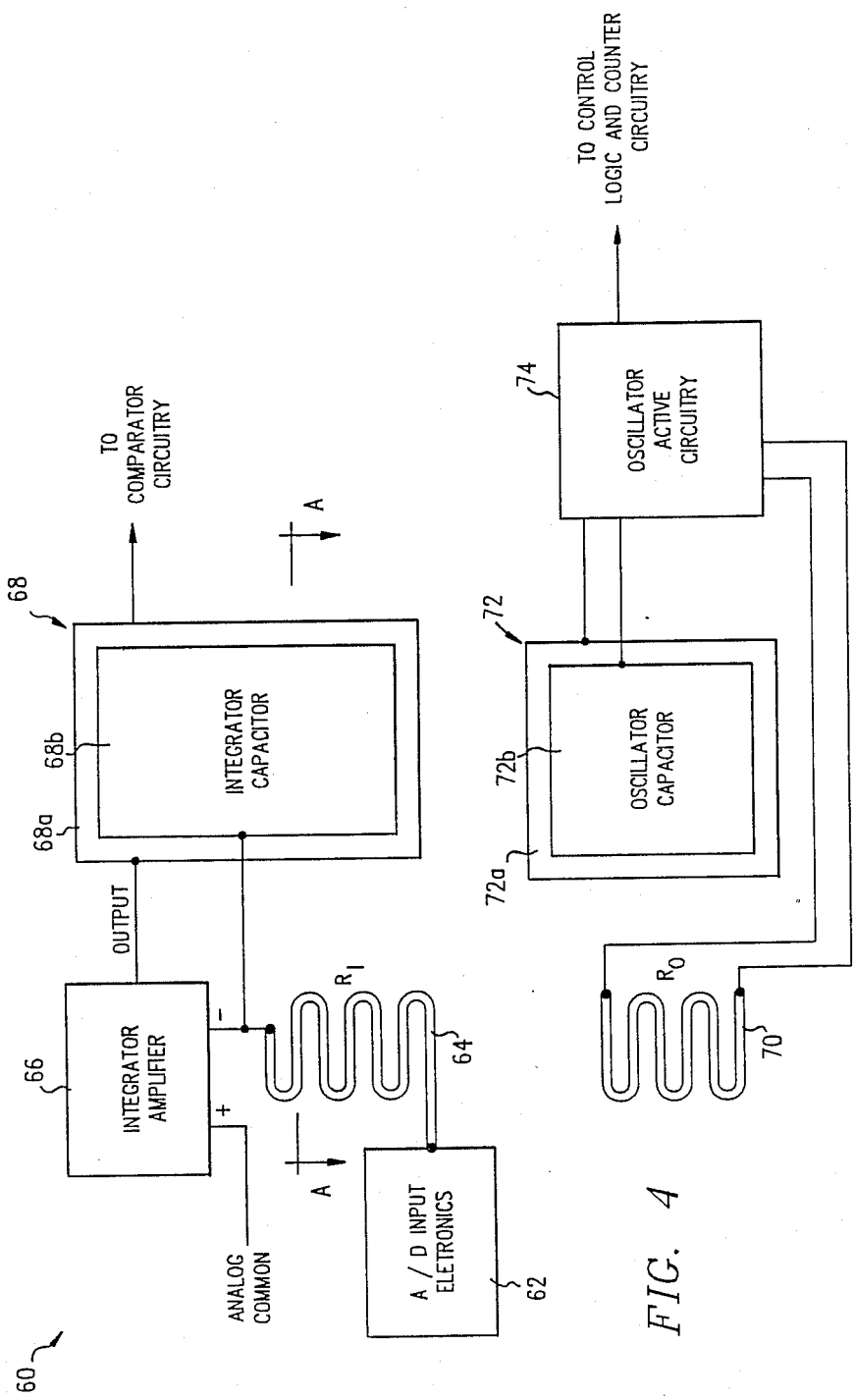
FIG. 4 is a top plan of the integrator and oscillator sections of an integrated dual-slope A/D converter.

Referring now to FIG. 4, a top plan of the integrated circuit is illustrated which allows the resistors and capacitors of the integrator and oscillator to maintain predetermined ratios despite manufacturing inaccuracies. The integrated circuit 60 has its input electronics 62 (including the multiplexer 20, the reference voltage source 24 and the input electronics for the input voltage 22) connected to one end of an integrator resistor 64 corresponding to the integrator resistor $R_I$ 28. The other end of the integrator resistor 64 is connected to one input of the integrator amplifier 66 and to the top plate 68b of the integrator capacitor 68. The other input of the integrator amplifier 66 is connected to the analog common. The output of the integrator amplifier 66 is connected to the bottom plate 68a of the integrator capacitor 68 and to one input of the comparator 32. With regards to implementation of the oscillator 12, an oscillator resistor 70 and an oscillator capacitor 72 having bottom and top plates 72a and b and are connected to the oscillator active circuitry 74. The output of oscillator active circuitry 74 is connected to the control logic and counter section 18.

In the preferred embodiment, implanted polysilicon resistors are used to implement the integrator and oscillator resistors 64 and 70. In this embodiment a polysilicon layer is formed and implanted to reduce its sheet resistance. In another embodiment, thin film technology could be used to implement the resistors. Less preferably, diffused resistors could be used.

In the illustrated embodiment, serpentine resistors are used. Alternatively, the polysilicon can be formed in stripes and interconnected by metal contacts to create a resistive path.

In processing integrated circuits, the sheet resistance of a polysilicon resistor depends primarily on its implant dose and implant energy. By placing two resistors closely together on an integrated circuit, the implant dose and implant energy will be the same for both resistors. Thus, the resistor ratio is set by physically forming one resistor longer than the other. For example, if on a given chip, the integrator resistor is 25% high, then the oscillator resistor will also be approximately 25% high as well. Thus, on a given chip, if the integrating resistor 64 is in close proximity to the oscillator resistor 70, the ratio of the resistor values will vary within a few percent of the ideal resistor ratio value and will not significantly affect the value of $V_{peakmax}$. Although the particular resistive values of the integrator resistor 64 and the oscillator resistor 70 may vary widely from lot to lot, the ratio of the sheet resistance of the resistors will remain relatively constant.

In the preferred embodiment, a constant resistor ratio is further enhanced by orienting the resistors in the same direction, i.e., forming the resistor stripes in a parallel fashion. An advantage of this embodiment is that any direction component, such as implant strength, thickness, etching, or doping, remains the same for each resistor.

Also, in the preferred embodiment, the stripes of both resistors 64 and 70 have a uniform width, with the resistivity increased by lengthening the transistor. This embodiment has the advantage of decreasing etching bias.

Similarly, the capacitors are placed within closed proximity to each other such that the polysilicon (or other material used) will have essentially the same density in each respective plate of the capacitor. In the preferred embodiment, the capacitor plates are placed on the same levels, i.e., the bottom plates of the capacitors 68a and 72a should be formed on the same layer, and the top plates of the capacitors 68b and 72b are formed on the same layer. Once again, the ratio between the values of the capacitor will vary only within a few percent and will not significantly affect the value of $V_{peakmax}$.

Another advantage in placing the resistors and capacitors in close proximity is that the corresponding pairs will be similarly affected by temperature changes on the chip, and the effect of the temperature change will be substantially nullified.

As well as providing smaller size, lower cost, and higher performance, implementing the dual-slope A/D converter on an integrated circuit has the advantage of allowing the designer of the chip to compensate for parasitic voltage and current effects without concern for unknown effects of circuitry outside of the chip. Also, since all critical leakage nodes are internal to the chip, special cleaning and coating of the printed circuit boards is not necessary.

Figure 5:
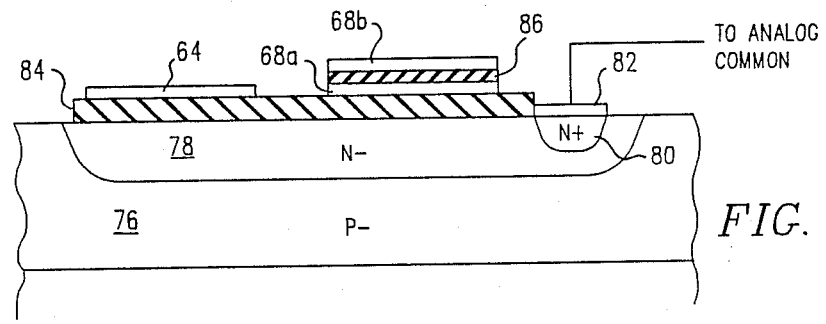
FIG. 5 is a cross-sectional view of the resistive and capacitive components of the integrated circuit of FIG. 4.

Referring now to FIG. 5, a cross-sectional view of the integrated circuit 60 across line A—A of FIG. 4 is shown. A P— substrate 76 has an N— well region 78. An N+ contact region 80 connects the N— well 78 to metal contact 82. The metal contact 82 is connected to analog common. A thick oxide layer 84 is placed over the N— well region 78. The oxide layer 84 is etched in the region above the N+ contact region 80 to allow connection with the metal contact 82. On top of the oxide layer 84, a polysilicon resistor layer (shown as the integrator resistor 64) is deposited and etched to form the resistor. The polysilicon layer undergoes a light implant to set its resistivity at a desired level. Also, the bottom plate 68a of the integrator capacitor 68 is deposited on top of the oxide layer 84. A second oxide layer 86 is grown or deposited on top of the first plate 68a. On top of the second oxide layer 86, the top plate 68b of the capacitor 68 is deposited.

The N— well region 78 creates a reversed biased pn junction between the N— well 78 and the P—substrate 76. This configuration has the technical advantage that substrate noise will not be capacitively coupled with the capacitor bottom plates 68a and 72a.

In the preferred embodiment, a polysilicon-polysilicon technology is used to fabricate the capacitors 68 and 72. Using this technology, the plates of the capacitors are formed as polysilicon layers, and subsequently implanted to reduce their resistivity. Less preferably, other technologies such as polysilicondiffusion, metal-diffusion, or metal-polysilicon can be employed to implement the capacitors.

It should be noted that FIG. 5 applies to N-well CMOS, P-well CMOS, and twin-well CMOS, other processes can be used with other processes, such as standard MOS and bipolar to implement the inventive concepts described herein.

Although a preferred embodiment of the invention has been described in detail, it should be understood that the various changes, substitutions and alterations can be made therein without departing from the spirit and scope of the invention as defined by the appended claims

What is claimed is:

1. An integrated dual-slope analog-to-digital converter comprising:

an input for receiving an analog voltage for conversion to a numerical value corresponding to said analog voltage;

an oscillator having a first resistor and a first capacitor having approximate desired values, the frequency of oscillations of said oscillator being inversely proportional to the product of the values of said first resistor and said first capacitor;

an integrator having a second resistor and a second capacitor having approximate desired values for integrating said analog voltage over a first time interval and integrating a reference voltage over a second time interval, the rate of integration of said integrator being inversely proportional to the product of the values of said second resistor and second capacitor;

said first and second resistors each having an actual value in operation which varies from its respective desired value by the same proportion, resulting in a constant ratio between said first and second resistor; and, said first and second capacitors each having an actual value in operation which varies from its respective desired value by the same proportion, resulting in a constant ratio between said first and second capacitors wherein said constant ratios result in a predetermined maximum output voltage of said integrator.

2. The converter of claim 1 wherein said first and second resistors comprise strips of resistive material.

3. The converter of claim 2 wherein said stripes of said first resistor and said second resistor are aligned parallel to each other.

4. The converter of claim 2 wherein said stripes of said first and second resistors have a uniform width.

5. The converter of claim 1 and further comprising a substrate and a shielding region for isolating said first and second resistors and said first and second capacitors from capacitively coupled substrate noise.

6. The converter of claim 1 wherein said first and second resistors vary proportionally with deviations in temperature.

7. The converter of claim 1 wherein the first and second capacitors vary proportionally with deviations in temperature.

8. The converter of claim 1 and further including circuitry for negating parasitic effects.

9. The converter of claim 1 wherein said capacitors have polysilicon plate regions.

10. The converter of claim 1 wherein said resistors have a serpentine configuration.

11. The converter of claim 1 wherein said integrator is operable to produce a predetermined maximum output by integrating the maximum allowable analog voltage over a predetermined number of oscillations produced by said oscillation, said predetermined maximum output unaffected by the actual values of said second resistor and said second capacitor.

12. The converter of claim 1 wherein said first time interval comprises a predetermined number of oscillations and said second time interval comprises a measured number of oscillations.

13. The converter of claim 1 wherein said first and second resistors are formed within a predetermined distance such that both resistors vary from their respective desired values by the same factor.

14. The converter of claim 13 wherein said predetermined distance is $30 \times 10^{-3}$ inches.

15. The converter of claim 1 wherein said first and second capacitor have corresponding plates formed on the same layers.

16. An integrated dual-slope analog-to-digital converter comprising:
an input for receiving an analog voltage for conversion to a numerical value corresponding to said analog voltage;
an oscillator having a first resistor and a first capacitor having approximate desired values, the frequency of oscillations of said oscillator being inversely proportional to the product of the values of said first resistor and said first capacitor;
an integrator having a second resistor and a second capacitor having approximate desired values for integrating said analog voltage over a first time interval and integrating a reference voltage over a second time interval, the rate of integration of said integrator being inversely proportional to the product of the values of said second resistor and said second capacitor;
said first and second resistors being close to each other and substantially simultaneously formed on said integrated circuit such that manufacturing inaccuracies affect the values of both resistors proportionally;
said first resistor and said second resistor comprising stripes, said stripes aligned in parallel and having a substantially uniform width; and
said first and second capacitors being close together, such that manufacturing and accuracies affect the values of both capacitors proportionally.

17. An integrated dual-slope analog-to-digital converter comprising:
an input for receiving an analog voltage for conversion to a numerical value corresponding to said analog voltage;
an oscillator having a first resistor and a first capacitor having approximate desired values, the frequency of oscillations of said oscillator being inversely proportional to the product of the values of said first resistor and said first capacitor;
an integrator having a second resistor and a second capacitor having an approximate desired value for integrating said analog voltage over a first time interval and integrating a reference voltage over a second time interval, the rate of integrating of said integrator being inversely proportional to the product of the values of said second resistor and said second capacitor;
said first and second resistors each having an actual value in operation which varies from respective said approximate desired values in the same proportion, resulting in a constant ratio between said first and second resistors;
a substrate region having a predetermined conductivity type;
an isolation region having a second conductivity type opposite said first conductivity type; and
a contact region connecting said isolation region to an analog common.

18. The converter of claim 17 wherein said substrate is a P− conductivity type and said isolation region is N− conductivity type.

19. A voltmeter comprising:
an integrator having a first resistor and first capacitor, the rate of integration being inversely proportional to the product of the values of said first resistor and first capacitor;
an oscillator having a second resistor and second capacitor, the frequency of oscillation being inversely proportional to the product of the values of said second resistor and second capacitor;
said first and second resistors having a substantially constant ratio of their values despite variation of their respective actual values due to manufacturing inaccuracies, and
said first and second capacitors having a substantially constant ratio of their values despite variation of their respective actual values due to manufacturing inaccuracies.

20. The voltmeter of claim 19 wherein said oscillator and integrator are formed on an integrated circuit.

21. The voltmeter of claim 20 wherein said first and second resistors comprise stripes of resistive material aligned in a parallel fashion.

22. The voltmeter of claim 20 wherein said first and second resistors are positioned close to each other.

23. The voltmeter of claim 20 wherein respective plates of said capacitors are formed substantially simultaneously.

24. The voltmeter of claim 20 wherein respective plates of said capacitor are formed on the same level.

* * * * *